(12) United States Patent
Delano

(10) Patent No.: US 6,549,069 B2
(45) Date of Patent: *Apr. 15, 2003

(54) SELF-TIMED SWITCHING FOR A DIGITAL POWER AMPLIFIER

(75) Inventor: Cary L. Delano, Los Altos, CA (US)

(73) Assignee: Tripath Technology, Inc., San Jose, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 09/796,731

(22) Filed: Feb. 28, 2001

(65) Prior Publication Data

US 2001/0026174 A1 Oct. 4, 2001

Related U.S. Application Data

(60) Provisional application No. 60/186,861, filed on Mar. 3, 2000.

(51) Int. Cl.$^7$ ................................................ H03F 3/217
(52) U.S. Cl. .................................. 330/251; 330/207 A
(58) Field of Search .......................... 330/10, 207 A, 330/251

(56) References Cited

U.S. PATENT DOCUMENTS

| | | | |
|---|---|---|---|
| 5,023,566 A | 6/1991 | El-Hamamsy et al. | 330/251 |
| 5,479,337 A | 12/1995 | Voigt | 363/131 |
| 5,777,512 A | 7/1998 | Tripathi et al. | 330/207 A |
| 6,011,345 A * | 1/2000 | Murray et al. | 310/321 |
| 6,316,992 B1 * | 11/2001 | Miao et al. | 330/251 X |
| 6,348,836 B2 * | 2/2002 | Delano | 330/10 |
| 6,373,334 B1 * | 4/2002 | Melanson | 330/10 |

OTHER PUBLICATIONS

Karsten Nielson, "High–Fidelity PWM–Based Amplifier Concept For Active Loudspeaker Systems With Very Low Energy Consumption", J. Audio Eng. Soc., vol. 45 No. 7/8, Jul./Aug. 1997, p. 555–570.

* cited by examiner

*Primary Examiner*—Steven J. Mottola
(74) *Attorney, Agent, or Firm*—Beyer Weaver & Thomas, LLP

(57) ABSTRACT

An electronic device includes sampling circuitry and at least one switching device. Each switching device has resonance circuitry associated with the output terminal thereof. The resonance circuitry and the at least one switching device have at least one resonance oscillation associated therewith. The electronic device further comprises clock generation circuitry which generates a clock signal for the sampling circuitry at least in part from the at least one resonance oscillation.

24 Claims, 3 Drawing Sheets

US 6,549,069 B2

SELF-TIMED SWITCHING FOR A DIGITAL POWER AMPLIFIER

RELATED APPLICATION DATA

The present application claims priority from U.S. Provisional Patent Application No. 60/186,861 for SELF-TIMED SWITCHING FOR A DIGITAL POWER AMPLIFIER filed on Mar. 3, 2000, the entirety of which is incorporated herein by reference for all purposes.

BACKGROUND OF THE INVENTION

The present invention relates to noise-shaping digital amplifiers, and specifically to techniques for generating a sampling clock for such amplifiers. It should be noted at the outset that although the invention is described herein with reference to a band pass (e.g., RF) implementation, the present invention is also applicable to other amplifier configurations such as, for example, base band audio amplifiers or motor drive circuits.

FIG. 1 shows an RF bandpass noise-shaping amplifier 100 designed according to techniques described in U.S. Pat. No. 5,777,512 for METHOD AND APPARATUS FOR OVERSAMPLED, NOISE-SHAPING, MIXED-SIGNAL PROCESSING issued Jul. 7, 1998, the entire disclosure of which is incorporated herein by reference for all purposes. RF amplifier 100 includes a frequency selective network 102 which, using continuous-time feedback, noise shapes the modulated RF input. Network 102 comprises at least one resonator stage having a transfer function designed to pass a band centered around, for example, 900 MHz.

A/D converter 104 converts the noise shaped RF signal to digital data using a sampling frequency fs which, in this example, is 3.6 GHz. A/D converter 104 may comprise a single comparator. Alternatively, A/D converter 104 may comprise two comparators configured to implement three-level switching as described in copending U.S. patent application Ser. No. 09/796,845 for DUAL INDEPENDENTLY CLOCKED ANALOG-TO-DIGITAL CONVERSION FOR A DIGITAL POWER AMPLIFIER filed simultaneously herewith, the entire disclosure of which is incorporated herein by reference for all purposes.

Gate drive circuitry 106 takes the pulse train from A/D converter 104 and generates gate drive for each of FETs 108 and 110 of the power output stage of amplifier 100. The output power stage shown includes three inductors L1, L2 and L3, and capacitor C1. This configuration creates two separate resonances at nodes A and B respectively when the corresponding one of FETs 108 and 110 is off.

The continuous-time feedback to frequency selective network 102 is provided via feedback path 112. The output signal of the power stage is passed to a matching network 114 which passes the output RF signal to antenna 116 for transmission.

Using a fixed clock to generate the clock for A/D converter 104 (i.e., fs) has its drawbacks. First, it is generally desirable for the timing of the resonances at nodes A and B to match the timing of this clock to maximize efficiency. However, in reality, the resonances at nodes A and B tend to move around in frequency due, for example, to reflections from matching network 114 and process variations. Second, because of design complexity, it is generally undesirable to require a separate clock for the A/D converter in such a design.

It is therefore desirable to provide a sampling clock for the A/D converters in integrated circuit amplifiers which tracks output stage resonance oscillations yet does not add unduly to circuit complexity.

SUMMARY OF THE INVENTION

According to the present invention, one or more of the resonances in the output switching stage of an amplifier design are used to generate the clock signal(s) for the amplifier's A/D converter(s). According to one embodiment, where the output stage comprises two switching devices, the resonance nodes associated with the two devices are alternately used to generate the clocks signal(s).

Thus the present invention provides an electronic device including sampling circuitry and at least one switching device. Each switching device has resonance circuitry associated with the output terminal thereof. The resonance circuitry and the at least one switching device have at least one resonance oscillation associated therewith. The electronic device further comprises clock generation circuitry which generates a clock signal for the sampling circuitry at least in part from the at least one resonance oscillation.

A further understanding of the nature and advantages of the present invention may be realized by reference to the remaining portions of the specification and the drawings.

DETAILED DESCRIPTION OF SPECIFIC EMBODIMENTS

Figure 1:
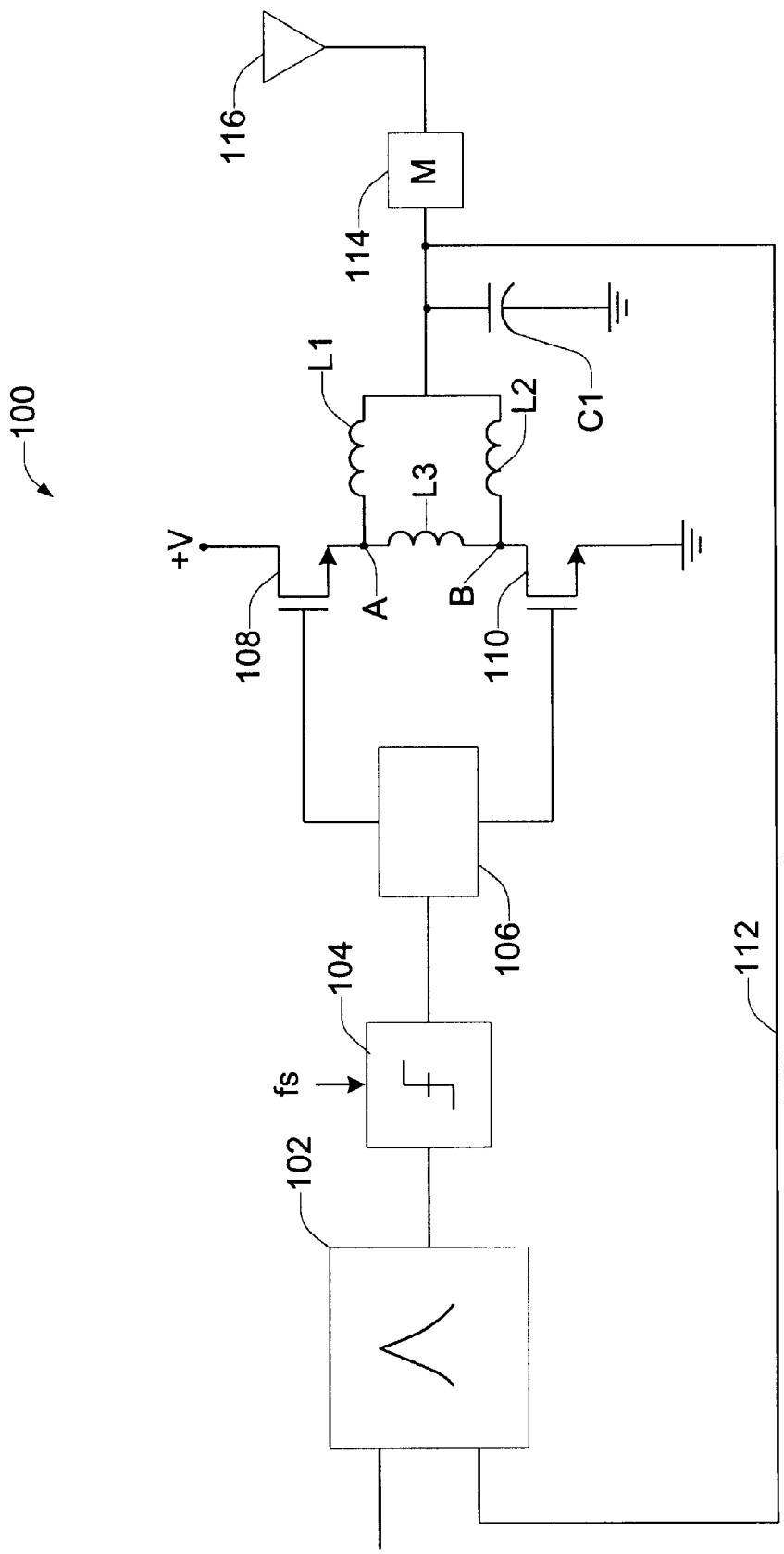
FIG. 1 shows a first noise-shaping amplifier architecture.
Figure 2:
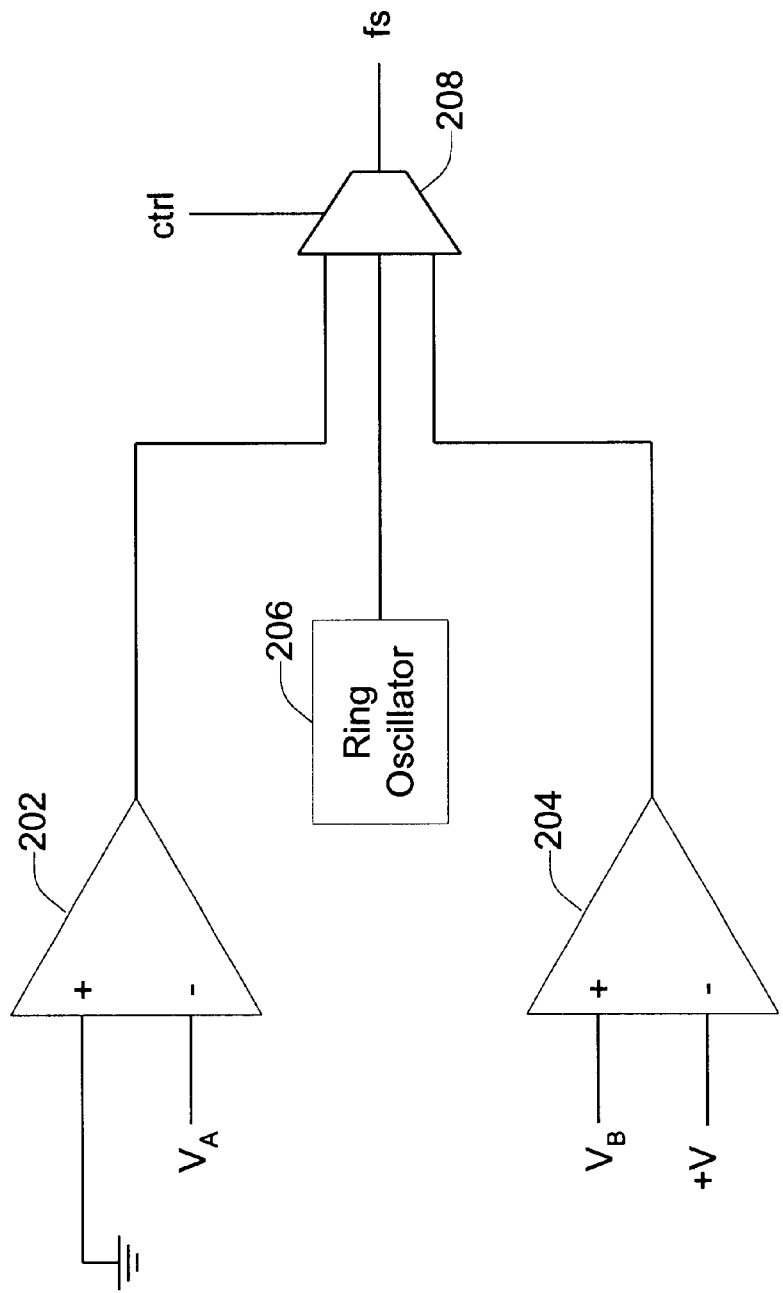
FIG. 2 shows clock generation circuitry designed according to a specific embodiment of the present invention.

A specific embodiment of the present invention will now be described with reference to FIGS. 1 and 2. That is, the circuit of FIG. 2 is used with the amplifier of FIG. 1 to effect one implementation of the clock generation technique described herein. According to a specific embodiment of the invention, the clock for A/D converter 104 (i.e., fs) is generated from at least one of the resonances at nodes A and B. According to a more specific embodiment, fs is provided in part by the resonance at node A and in part by the resonance at node B. The schematic of FIG. 2 shows one implementation by which this may be accomplished.

A comparator 202 compares the voltage at node A (i.e., $V_A$) to a voltage less than the positive supply of the power output stage, preferably ground. When node A resonates above and below ground at 3.6 GHz, a 3.6 GHz clock is generated. Likewise a comparator 204 compares the voltage at node B (i.e., $V_B$) to a voltage above ground (or the negative rail), preferably the positive supply, thereby generating a 3.6 GHz clock when node B resonates. Multiplexer 208 selects between its inputs in response to a control signal generated by control logic (not shown) which, according to a specific embodiment is dependent on decisions from comparator 104. In this way, multiplexer 208 generates the clock signal fs. When the circuit is first turned on, the clock signal may be started by generation of a pulse which gets one of the resonances going. According to one embodiment, this may be accomplished by multiplexer 208 selecting ring oscillator 206.

One advantageous consequence of this clock generation technique is that, because the clock is generated at least in part from the resonances at nodes A and B, when these resonances move around (e.g., due to reflections and process variations), the clock to the comparator moves around in a corresponding manner. That is, the gate edges generated by A/D converter 104 and gate drive circuitry 106 more closely match the timing of the output stage resonances than if an independently generated A/D clock were used. This better aligns the switching edges to the resonances to improve efficiency.

Moreover, the pattern dependent jitter on the A/D converter clock due to the manner in which the resonances move around effectively scrambles the sample rate and "smears" sampling frequency dependent tones into randomized noise, thereby eliminating undesirable harmonics about the sampling frequency in the output power spectrum. In fact, according to the present invention, "dithering" of the A/D converter clock may be intentionally introduced in a controlled manner irrespective of how the clock was generated (e.g, independent vs. self-timed) to smear the noise tones dependent on the sampling frequency.

Referring back to FIG. 2 and according to a more specific embodiment of the invention, a ring oscillator 206 may also be included in the clock generation circuitry as an additional source of the clock signal. This may be desirable because the damping resistance associated with the output resonant circuits could be high enough to cause the resonance oscillations to decay sufficiently such that they no longer trip comparators 202 and 204 and the clock (and therefore the gate signal) locks up. Therefore, after some number of pulses generated from one of the resonance nodes (which may be determined empirically from the damping resistance associated with the resonant circuits of the output stage) multiplexer 208 is controlled to select the input from the ring oscillator as the clock signal until the resonance on the other node begins. According to a specific embodiment, the ring oscillator starts and stops synchronously with the resonance oscillations so that the handoffs between clock sources are smooth.

Figure 3:
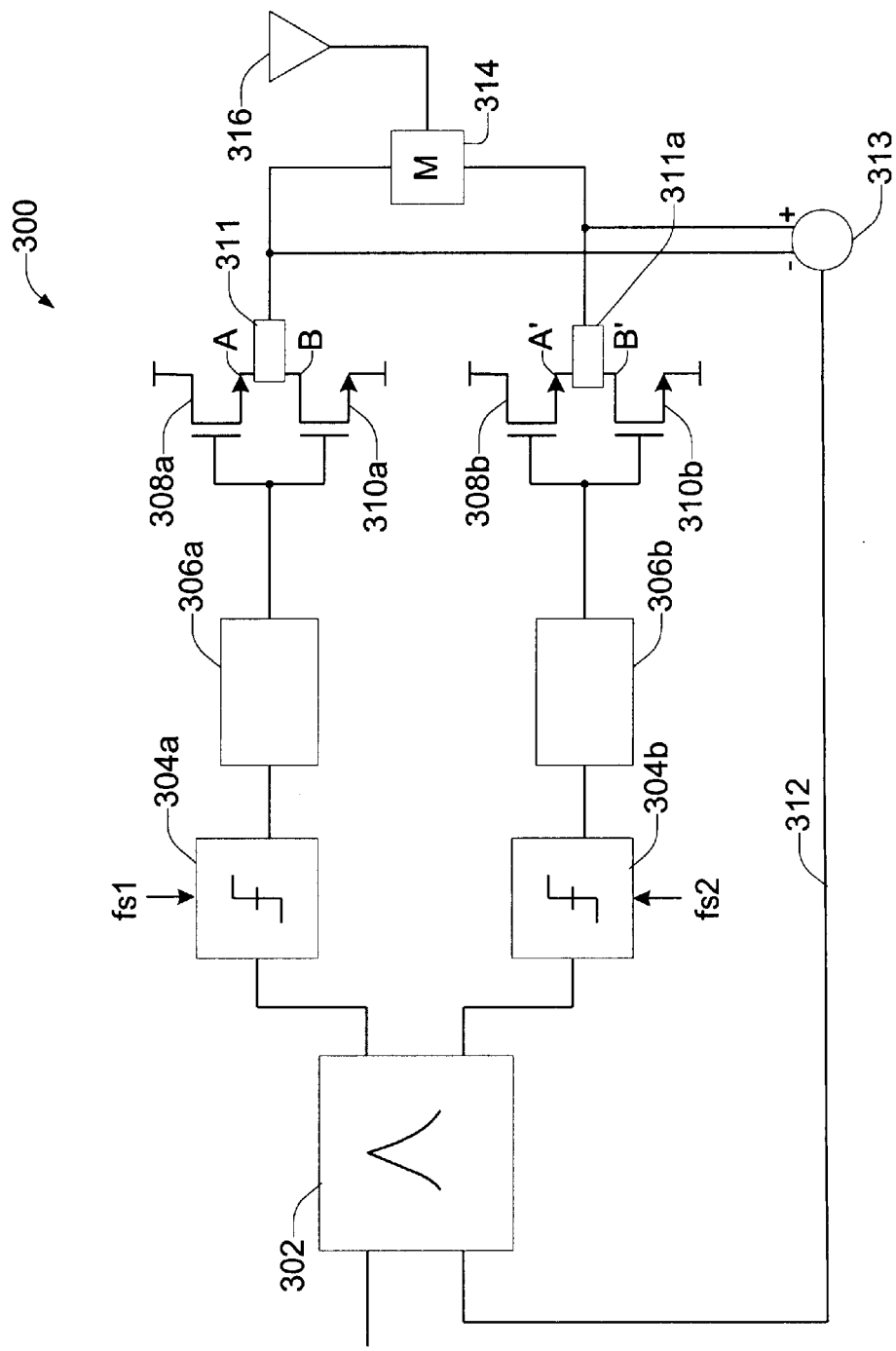
FIG. 3 shows a second noise-shaping amplifier architecture.

According to a specific embodiment, the multi-level switching invention described in the copending application referenced above may be enhanced using the technique described herein to provide a self-generated clock for each of multiple and independently clocked AID converters. A specific example of such an embodiment will now be described with reference to FIG. 3 which shows an RF bandpass noise-shaping amplifier 300 also designed according to the techniques described in U.S. Pat. No. 5,777,512 incorporated by reference above. RF amplifier 300 includes a frequency selective network 302 which, using continuous-time feedback, noise shapes the modulated RF input. According to a specific embodiment, network 302 comprises at least one resonator stage having a transfer function designed to pass a band centered around 900 MHz.

Two A/D converters 304a and 304b convert the noise shaped RF signal to digital data using independently generated clock signals at a nominal sampling frequency fs (i.e., fs1 and fs2) which, according to a specific embodiment, is 3.6 GHz. According to one embodiment, A/D converters 304a and 304b comprise two comparators configured to implement three-level switching.

Gate drive circuits 306a and 306b takes the pulse trains from A/D converters 304a and 304b, respectively, and generate gate drive for their pair of transistors, i.e., FETs 308a and 310a or FETs 308b and 310b. Each pair of transistors has two separate resonances due to resonator circuits 311 and 311a respectively. That is, the power stage comprising FETs 308 and 310 has separate resonances at nodes A and B, while the stage comprising FETs 308a and 310a has separate resonances at nodes A' and B'.

Continuous-time feedback is provided to frequency selective network 302 via feedback path 312 and adder 313. The output signals of the power stages are passed to a matching network 314 which passes the output RF signal to antenna 316 for transmission. In an alternate embodiment, adder 313 is part of matching network 314.

Having two comparators for A/D converters 304a and 304b allows the digital data to have three quantization states, i.e., three-level switching, rather than two. With two quantization states there is a high number of signal transitions resulting in high drive losses. By contrast, with three states a "0" state can be selected when there is no signal output to avoid unnecessary switching losses.

The clocks for the respective comparators 304a and 304b can be generated from independent sources. According to a specific embodiment of the invention, the clock signals are independently generated according to the techniques of the present invention. That is, according to a specific embodiment of the invention, the clocks for A/D converters 304a and 304b (i.e., fs1 and fs2) are generated from at least some of the resonances at nodes A, B, A' and B'. According to a more specific embodiment, fs1 is provided in part by the resonance at node A and in part by the resonance at node B, while fs2 is provided in part by the resonance at node A' and in part by the resonance at node B'. The schematic of FIG. 2 shows one implementation by which generation of fs1 and fs2 may be accomplished. It will be understood, however that there are other ways in which these clock signals may be generated.

In addition to the randomization of switching frequency dependent noise, there are additional noise benefits due to the independent nature of the two clocks. This is related to the fact that the average clock frequencies fs1 and fs2 typically differ by some relatively constant amount which is, in essence, the smallest repetitive sample rate experienced by the amplifier. That is, the difference between fs1 and fs2 results in an "effective" sample frequency which is much higher than either fs1 or fs2. As a result, any undesirable tones or "radiators" in the output noise spectrum which depend on the sample frequency are moved way out of the band of interest due to this very high "effective" sample frequency.

According to a specific embodiment, the difference between fs1 and fs2 is intentionally introduced and controlled to derive the benefit of this effect. According to a more specific embodiment in which the clocks fs1 and fs2 are generated from stable independent sources other than the resonance nodes, the difference between fs1 and fs2 is controlled to derive this benefit. Even where fs1 and fs2 are derived from a single source, the difference may be introduced to derive the benefit and still remain within the scope of the invention.

While the invention has been particularly shown and described with reference to specific embodiments thereof, it will be understood by those skilled in the art that changes in the form and details of the disclosed embodiments may be made without departing from the spirit or scope of the invention. For example, an embodiment could be envisioned in which the clock signal is derived from only one of nodes A and B in combination with a ring oscillator. Such an embodiment may be less desirable in that the gate pulses applied to the input of the power stage would be less likely to match the timing of the other resonance. However, such an embodiment is clearly within the scope of the present invention.

It should also be noted that although the invention is described herein with reference to a bandpass (e.g., RF) implementation, the present invention is also applicable to other amplifier configurations such as, for example, baseband audio amplifiers. Therefore, the scope of the invention should be determined with reference to the appended claims.

What is claimed is:

1. An electronic device comprising sampling circuitry and at least one switching device having an output terminal, each switching device having resonance circuitry associated with the output terminal thereof, the resonance circuitry and the at least one switching device having at least one resonance oscillation associated therewith, the electronic device further comprising clock generation circuitry which generates a clock signal for the sampling circuitry at least in part from the at least one resonance oscillation.

2. The electronic device of claim 1 wherein the at least one resonance oscillation comprises first and second resonance oscillations, and the at least one switching device comprises first and second switching devices configured as an output stage of the electronic device, the first and second resonance oscillations being associated with the first and second switching devices, respectively, the clock signal being generated by the clock generation circuitry at least in part from the first and second resonance oscillations.

3. The electronic device of claim 2 further comprising a ring oscillator having a ring oscillation associated therewith, the clock signal being generated by the clock generation circuitry from the first and second resonance oscillations and the ring oscillation.

4. The electronic device of claim 3 further comprising multiplexing circuitry for selecting among first, second and third clock signal options corresponding to the first and second resonance oscillations and the ring oscillation.

5. The electronic device of claim 4 wherein the multiplexing circuitry is configured to select the third signal option after selection of either of the first and second signal options.

6. The electronic device of claim 5 wherein selection of the third signal option after selection of the first and second signal options occurs following a predetermined number of periods of the first and second resonance oscillations, respectively.

7. The electronic device of claim 5 wherein the ring oscillation starts and stops synchronously with either of the first and second resonance oscillations.

8. The electronic device of claim 2 further comprising multiplexing circuitry for selecting among at least first and second clock signal options corresponding to the first and second resonance oscillations, respectively.

9. The electronic device of claim 3 wherein the ring oscillation is employed when the electronic device is initially powered up to start the at least one of the first and second resonance oscillations.

10. The electronic device of claim 1 wherein each switching device has a reference voltage associated therewith, the clock generation circuitry including at least one comparison circuit for comparing the resonance oscillation associated with each of the at least one switching devices to the corresponding reference voltage, the clock signal being generated at least in part therefrom.

11. The electronic device of claim 10 wherein the reference voltage comprises a supply voltage for the at least one switching devices.

12. The electronic device of claim 10 wherein the reference voltage comprises ground.

13. The electronic device of claim 2 wherein first switching device has a first supply voltage associated therewith and the second switching device has a second supply voltage associated therewith, the clock generation circuitry including a first comparison circuit for comparing the first resonance oscillation to the first supply voltage and a second comparison circuit for comparing the second resonance oscillation to the second supply voltage, the clock signal being generated at least in part therefrom.

14. The electronic device of claim 1 wherein the resonance circuitry associated with each switching device comprises at least one inductor and at least one capacitor, the at least one resonance oscillation being dependent thereon.

15. The electronic device of claim 1 further comprising dithering circuitry for dithering the clock signal before application to the sampling circuitry.

16. The electronic device of claim 1 wherein the sampling circuitry and the at least one switching device are configured for base band operation.

17. The electronic device of claim 16 wherein the base band frequency range comprises the audio band.

18. The electronic device of claim 1 wherein the sampling circuitry and the at least one switching device are configured for band pass operation.

19. The electronic device of claim 18 wherein the band pass frequency range comprises the radio frequency band.

20. The electronic device of claim 1 wherein the electronic device comprises an audio amplifier.

21. The electronic device of claim 1 wherein the electronic device comprises a wireless communication device.

22. The electronic device of claim 1 wherein the electronic device comprises a line driver for a digital subscriber line.

23. The electronic device of claim 1 wherein the electronic device comprises a motor driver.

24. The electronic device of claim 2 wherein the electronic device comprises an oversampled, noise-shaping, mixed-signal processor, comprising:

at least one resonator stage in a feedback loop, the at least one resonator stage having an input;

a discrete time sampling stage in the feedback loop coupled to the at least one resonator stage, the discrete time sampling stage for sampling an analog signal at a sample frequency only at discrete time intervals;

a switching stage in the feedback loop coupled to the sampling stage, the switching stage having an input and an output; and a continuous-time feedback path from the output of the switching stage to the input of the at least one resonator stage;

wherein the switching stage comprises the output stage, the discrete time sampling stage comprises the sampling circuitry, and wherein the sample frequency corresponds to the clock signal.

* * * * *